United States Patent [19]
Yako

[11] Patent Number: 6,165,677
[45] Date of Patent: *Dec. 26, 2000

[54] PHOTORESIST COMPOSITION

[75] Inventor: Yuko Yako, Takatsuki, Japan

[73] Assignee: Sumitomo Chemical Company, Limited, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/083,435

[22] Filed: May 22, 1998

[30] Foreign Application Priority Data

May 26, 1997 [JP] Japan .................................... 9-135255

[51] Int. Cl.[7] ..................................... G03F 7/004
[52] U.S. Cl. ........................................ 430/270.1; 430/170
[58] Field of Search ............................... 430/270.1, 192, 430/170

[56] References Cited

U.S. PATENT DOCUMENTS 5,580,695 12/1996 Murata et al. ....................... 430/270.1
5,593,812 1/1997 Babich et al. ....................... 430/270.1
5,817,444 10/1998 Sato et al. ................................ 430/155
5,962,180 11/1999 Iwanaga et al. ......................... 430/170
5,985,511 11/1999 Yako et al. ........................... 430/270.1

FOREIGN PATENT DOCUMENTS

0537524 A1  4/1993  European Pat. Off. .
0558280 A1  9/1993  European Pat. Off. .
0660187 A1  6/1995  European Pat. Off. .
0727713 A1  8/1996  European Pat. Off. .

*Primary Examiner*—Janet Baxter
*Assistant Examiner*—Rosemary Ashton
*Attorney, Agent, or Firm*—Birch, Stewart, Kolasch & Birch LLP

[57] ABSTRACT

A chemical amplifying type positive photoresist composition, excellent in various properties, and not form necking at the potion where the bottom antireflective coating and the resist film contact, which comprises (A) a resin which is converted to alkali-soluble from alkali-insoluble or alkali slightly soluble by the action of an acid, (B) an acid generator, (C) a tertiary amine compound and (D) a diphenyl sulfone compound, and a fine photoresist pattern can be formed in high precision using the photoresist composition.

14 Claims, No Drawings

PHOTORESIST COMPOSITION

BACKGROUND OF THE INVENTION

The present invention relates to a photoresist composition suitable for lithography utilizing high-energy radiation such as a far ultraviolet ray including eximer laser, electron beam, X-ray, radiation or the like.

Recently, with the development of higher integration of an integrated circuit, formation of a submicron pattern is required. Eximer laser lithography has attracted special interest for such a requirement, particularly because it enables production of 64 MDRAM and 256 MDRAM. As a resist suitable for such eximer laser lithography process, a so-called chemical amplifying type resist has been suggested which utilizes an acid catalyst and has a chemical amplifying effect. In the chemical amplifying type resist, solubility of the portion irradiated with radiation in an alkaline developer is changed through a reaction utilizing an acid catalyst generated from an acid generator in the irradiated portion, and by this, a positive or negative pattern is obtained.

In the chemical amplifying type positive resist, an acid generated in the irradiated portion diffuses by post heat treatment (post exposure bake: hereinafter, abbreviated as PEB), and acts as a catalyst for changing solubility of the irradiated portion in a developer. Such a chemical amplifying type resist has a defect that the acid generator is liable to be decomposed by the reflected light from the substrate. For example, when the irradiated light is reflected to a lateral direction due to a difference in level on the substrate, the reflected light of a lateral direction causes so-called halation effect, which makes the line width of a part of the pattern narrower and makes it difficult to obtain a defined line width of the patten.

A bottom antireflective coating is generally used as the undercoating in order to suppress such halation effect. That is, generally, a bottom antireflective coating is formed on the substrate, and a resist film is formed on it, followed by irradiation and developing to form a pattern. As a bottom antireflective coating, "DUV-18" manufactured by Brewer Science and the like are known. However, there is a defect that a bottom antireflective coating causes a phenomenon called "necking" in which the pattern become narrower at the portion where the bottom antireflective coating and the resist film contact, and the pattern is liable to fall down or the resolution lowers.

SUMMARY OF THE INVENTION

The object of the present invention is to provide a chemical amplifying type positive photoresist composition excellent in various properties such as sensitivity, resolution, film retention ratio, applicability and heat resistance, particularly excellent in profile on a bottom antireflective coating. The present inventors have intensely studied for attaining such object and, as a result, found that a positive photoresist composition having excellent performance is obtained by adding a specific compound to a positive photo resist composition. This present invention was thus completed.

The present invention provides a positive photoresist composition comprising (A) a resin which is converted to alkali-soluble from alkali-insoluble or alkali slightly soluble by the action of an acid, (B) an acid generator, (C) a tertiary amine compound and (D) a diphenyl sulfone compound.

The resin (A) which is a main component of the photoresist component is by itself alkali-insoluble or alkali slightly soluble, and becomes alkali-soluble by a chemical reaction caused by the action of an acid. For example, there is used a resin obtained by protecting at least a part of a phenolic hydroxyl group in an alkali soluble resin having a phenol skeleton with a group which has solution inhibiting ability against alkaline developers and is insecure against acid.

Examples of the alkali soluble resin used for producing the resin (A) include novolak resins, polyvinylphenol resins, polyisopropenylphenol resins, copolymers of vinylphenol with styrene, acrylonitrile, methyl methacrylate or methyl acrylate, and copolymers of isopropenylphenol with styrene, acrylonitrile, methyl methacrylate or methyl acrylate. Positional relation between a hydroxy group and a vinyl group or an isopropenyl group in vinylphenol and isopropenylphenol is not particularly limited, however, in general, p-vinylphenol or p-isopropenylphenol is preferred. Hydrogen may also be added to these resins for improving transparency. An alkyl group, alkoxy group and the like may be introduced into a phenol nucleus of the above-described resins, as long as the resulting resin is alkali-soluble. Among these alkali soluble resins, polyvinylphenol-based resins, namely a homopolymer of vinylphenol or copolymer of vinylphenol with other monomer are preferably used.

The group to be introduced in the alkali soluble resin which has solution inhibiting ability against an alkali developer and is insecure against acid can be selected from various known protecting groups. Examples thereof include a tert-butoxycarbonyl group, tert-butoxycarbonylmethyl group, tetrahydro-2-pyranyl group, tetrahydro-2-furyl group, methoxymethyl group and 1-ethoxyethyl group. These groups shall be substituted for hydrogen on a phenolic hydroxyl group. Among these protecting groups, particularly, 1-ethoxyethyl group is preferred. The ratio of the phenolic hydroxyl groups substituted by the protecting group to the all phenolic hydroxyl groups in the alkali soluble resin (protective group introducing ratio) is preferably from 10 to 50%, in general.

It is preferred that the resin (A) comprises a resin obtained by protecting a phenolic hydroxyl group in the above-described polyvinylphenol-based resin with a group which has solution inhibiting ability against an alkali developer and is insecure against acid. Among them, particularly preferred is a resin obtained by partially protecting a phenolic hydroxyl group in the polyvinylphenol-based resin with a 1-ethoxyethyl group.

The acid generator (B) can be selected from various compounds which generate an acid by irradiation to the substance itself or a resist composition containing the substance. The acid generator (B) can be used as a mixture of two or more compounds. Examples thereof include onium salts, organic halogen compounds, compounds having a diazomethanedisulfonyl skeleton, disulfone compounds having an aromatic group, orthoquinone diazide compounds and sulfonic acid compounds. In the present invention, as the acid-generator, compounds having a diazomethanedisulfonyl skeleton are preferably used. Examples of the compounds having a diazomethanedisulfonyl skeleton as the acid generator include bis(benzenesulfonyl)diazomethane, bis(4-chlorobenzenesulfonyl)diazomethane, bis(p-toluenesulfonyl)diazomethane, bis(4-tert-butylbenzenesulfonyl)diazomethane, bis(2,4-xylenesulfonyl)diazomethane and bis(cyclohexanesulfonyl)diazomethane.

A tertiary amine compound (C) is added to the composition of the present invention as a quencher. It is known that the performance of a chemical amplifying type resist changes depending on the standing time from irradiation to PEB, the so-called time delay effect, which is caused by the deactivation of an acid generated in a resist by a small amount of ammonia or amines existing in environmental atmosphere. The tertiary amine compound (C) is used in order to prevent the deactivation of an acid. It is preferable that the tertiary amine compound (C) is a compound which does not vaporizes at pre-baking temperature, so that it remains in a resist film formed on a substrate even after pre-baking of the resist film and exhibits effect. Therefore, in general, a compound having the boiling point of 150° C. or higher is used as the tertiary amine compound (C).

In addition to the above-described resin (A), the acid generator (B) and the tertiary amine compound (C), the photoresist composition of the present invention comprises (D) a diphenyl sulfone compound. Necking on a bottom antireflective coating is suppressed by incorporating the diphenyl sulfone compound (D).

The diphenyl sulfone compound (D) has two phenyl groups which are linked through a sulfonyl group (—SO$_2$—). The two phenyl groups may be same to or different from each other and may be optionally substituted. The diphenyl sulfone compound (D) may be, for example, a compound represented by the following formula (I):

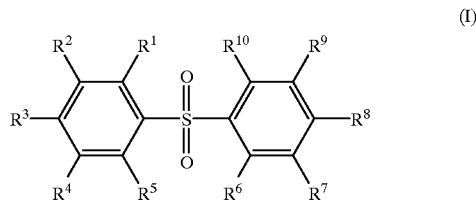

wherein R$^1$, R$^2$, R$^3$, R$^4$, R$^5$, R$^6$, R$^7$, R$^8$, R$^9$ and R$^{10}$ each independently represent hydrogen or a group which can bond to phenyl, provided that R$^1$ and R$^{10}$ may optionally be linked directly. Examples of the group which can bond to phenyl include alkyl having 1–4 carbon atoms, alkoxy having 1–4 carbon atoms, halogen, nitro and hydroxyl.

Specific examples of the diphenyl sulfone compound (D) include diphenyl sulfone, 4-chlorodiphenyl sulfone, 4,4'-dichlorodiphenyl sulfone, 4-fluorodiphenyl sulfone, 4,4'-difluorodiphenyl sulfone, 4-bromodiphenyl sulfone, 4,4'-dibromodiphenyl sulfone, 4,4'-dihydroxydiphenyl sulfone and dibenzothyophenesulfone.

Preferably, the amount of the resin (A) is from 20 to 99% by weight, the amount of the acid-generator (B) is from 0.05 to 20% by weight, the amount of the tertiary amine compound is from 0.001 to 10% by weight and the amount of the diphenyl sulfone compound (D) is 0.01 to 20% by weight based on the weight of total solid component of this composition. The photoresist composition of the present invention may optionally comprise other components, for example, various additives conventionally used in this field such as a dissolution inhibitor, sensitizers, dye, adhesion improver and electron donor.

A resist solution is prepared by mixing the above respective components with a solvent so that the concentration of the total solid content in this positive photoresist composition is within the range from 10 to 50% by weight. The solution is coated on a substrate such as silicon wafer. The solvent used may be any one which can dissolve the respective components and may be those which are normally used in this field. Examples thereof include glycol ether esters such as ethylcellosolve acetate, methylcellosolve acetate, propylene glycol monomethyl ether acetate and propylene glycol monoethyl ether acetate, glycol mono or diethers such as ethylcellosolve, methylcellosolve, propylene glycol monometyl ether, propylene glycol monoethyl ether and diethylene glycol dimethyl ether, esters such as ethyl lactate, butyl lactate and ethyl pyruvate, ketones such as 2-heptanone, cyclohexanone and methyl isobutyl ketone, and aromatic hydrocarbons such as xylene. These solvents may be used alone or in combination of two or more.

A positive pattern is formed from the resist film coated on a substrate, usually via respective processes such as pre-baking, patterning exposure, PEB, developing with an alkali developer.

The following example further illustrates the present invention in detail, but does not limit the scope thereof. In the example, reference example and comparative example, all "part" or "parts" are by weight unless otherwise stated.

REFERENCE EXAMPLE

PROTECTION OF RESIN

Into a nitrogen-purged 500 ml four-necked flask were charged 25 g (208 mmol in terms of p-vinylphenol unit) of poly(p-vinylphenol) having a weight average molecular weight (Mw) of 23,900 and a polydispersion (Mw/Mn) of 1.12 [VP-15000 manufactured by Nippon Soda Co., Ltd.) and 0.021 g (0.109 mmol) of p-toluenesulfonic acid, and they were dissolved in 250 g of 1,4-dioxane. To this solution was added dropwise 7.88 g (109 mmol) of ethylvinyl ether, then, the mixture was reacted at 25° C. for 5 hours. Thereafter, the reaction solution was added dropwise into 1500 ml of ion-exchanged water, then filtered to obtain a white wet cake. This wet cake was again dissolved into 200 g of 1,4-dioxane, then the solution was added dropwise to 1500 ml of ion-exchanged water, and filtered. The resulted wet cake was washed by stirring in 600 g of ion-exchanged water, and filtered to take a wet cake. Thereafter, this washing operation using this ion-exchanged water was repeated twice. The resulted white wet cake was dried under reduced pressure to obtain a resin in which a hydroxyl group of poly(p-vinylphenol) was partially 1-ethoxyethyl etherified. This resin was analyzed by $^1$H-NMR to find that 35% of the hydroxy group wasprotected bya 1-ethoxyethyl group. This resin had a weight average molecular weight of 31,200 and a polydispersion of 1.17.

Example 1

13.5 parts of the resin synthesized in Reference Example, 0.5 parts of bis(cyclohexanesulfonyl)diazomethaneas anacidgenerator, 0.02 parts of tris[2-(2-methoxyethoxy)ethyl]amine and 0.5 parts of diphenyl sulfone were dissolved in 67 parts of propylene glycol monomethyl ether acetate. The resulted solution was filtrated through a filter made of a fluorine resin having a pour size of 0.1 µm to prepare a resist solution.

On a silicone wafer washed by a conventional method, "DUV-18", an organic composition for bottom antireflective coating manufactured by Brewer Science was coated, and the silicone wafer was baked at 205° C. for 1 minute to prepare a silicone wafer with a bottom antireflective coating having a thickness after drying of 570 Å. Then, the resist solution obtained-above was coated using a spin coater so that the thickness after drying was 0.7 µm. Thereafter, this silicone wafer was pre-baked at 90° C. for 90 seconds on a hot plate. The film after the pre-baking was subjected to exposure treatment using KrF eximer laser stepper having an exposure wavelength of 248 nm [NSR-1755 EX8Amanufactured by Nikon Corp., NA=0.45) with changing exposure amount stepwise, through a chromium mask having a pattern. After the exposure, the wafer was heated for 90 seconds at 100° C. on a hot plate for conducting PEB to effect de-protective group reaction in the exposed portion. This was developed with 2.38% by weight aqueous solution of tetramethylaminium hydroxide to obtain a positive pattern.

The pattern thus formed was observed by an electron microscope. A fine pattern of 0.23 μm was resolved in good profile at an exposure of 46 mJ/cm². No necking was observed at the portion where the bottom antireflective coating and the resist film contact.

Example 2

The same procedure as in Example 1 was conducted except that tris[2-(2-methoxyethoxy)ethyl]amine, the quencher, was replaced by N-methyl-di-n-octylamine, and the PEB was conducted at 100 ° C. for 1 minute.

A fine pattern of 0.22 μm was resolved in good profile at an exposure of 75 mJ/cm². No necking was observed at the portion where the bottom antireflective coating and the resist film contact.

Example 3

The same procedure as in Example 1 was conducted except that diphenyl sulfone was replaced by 4,4'-dichlorodiphenyl sulfone.

A fine pattern of 0.24 μm was resolved in good profile at an exposure of 38 mJ/cm². No necking was observed at the portion where the bottom antireflective coating and the resist film contact.

Using the photoresist composition according to the present invention which comprises a diphenyl sulfone compound, no necking was formed at the portion where the bottom antireflective coating and the resist film contact, and a pattern in good profile was obtained with excellent resolution and sensitivity. Therefore, a fine photoresist pattern can be formed in high precision using the photoresist composition of the present invention.

What is claimed is:

1. A positive photoresist composition comprising (A) a resin which is converted to alkali-soluble from alkali-insoluble or alkali slightly soluble by the action of an acid, (B) a diazomethanedisulfonyl compound, (C) a tertiary amine compound and (D) a diphenyl sulfone compound.

2. The composition according to claim 1, wherein the diphenyl sulfone compound (D) is a compound represented by the following formula (I):

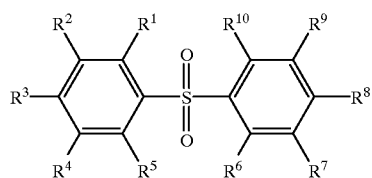

(I)

wherein $R^1$, $R^2$, $R^3$, $R^4$, $R^5$, $R^6$, $R^7$, $R^8$, $R^9$ and $R^{10}$ each independently represent hydrogen or a group which can bond to phenyl, provided that $R^1$ and $R^{10}$ may optionally be linked directly.

3. The composition according to claim 1, wherein the amount of the resin (A) is from 20 to 99% by weight, the amount of the acid-generator (B) is from 0.05 to 20% by weight, the amount of the tertiary amine compound is from 0.001 to 10% by weight and the amount of the diphenyl sulfone compound (D) is 0.01 to 20% by weight based on the weight of the total solid component of the composition.

4. The composition according to claim 1, wherein the tertiary amine compound (C) has a boiling point of at least 150° C.

5. The composition according to claim 1, wherein the diphenyl sulfone compound (D) is selected from the group consisting of diphenyl sulfone, 4-chlorodiphenyl sulfone, 4,4'-dichlorodiphenyl sulfone, 4-fluorodiphenyl sulfone, 4,4'-difluorodiphenyl sulfone, 4-bromodiphenyl sulfone, 4,4'-dibromodiphenyl sulfone, 4,4'-dihydroxydiphenyl sulfone and dibenzothyophenesulfone.

6. A positive photoresist composition comprising (A) a resin which is converted to alkali-soluble from alkali-insoluble or alkali slightly soluble by the action of an acid, wherein the resin is obtained by protecting at least a part of phenolic hydroxyl groups in an alkali soluble resin having a phenol skeleton with 1-ethoxyethyl group, (B) an acid generator, (C) a tertiary amine compound and (D) a diphenyl sulfone compound, wherein the acid generator (B) is a diazomethanedisulfonyl compound.

7. The composition according to claim 6, wherein the tertiary amine compound (C) has a boiling point of at least 150° C.

8. The composition according to claim 6, wherein the diphenyl sulfone compound (D) is selected from the group consisting of diphenyl sulfone, 4-chlorodiphenyl sulfone, 4,4'-dichlorodiphenyl sulfone, 4-fluorodiphenyl sulfone, 4,4'-difluorodiphenyl sulfone, 4-bromodiphenyl sulfone, 4,4'-dibromodiphenyl sulfone, 4,4'-dihydroxydiphenyl sulfone and dibenzothyophenesulfone.

9. The composition according to claim 6, wherein the diphenyl sulfone compound (D) is a compound represented by the following formula (I):

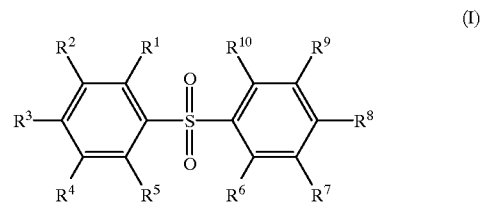

(I)

wherein $R^1$, $R^2$, $R^3$, $R^4$, $R^5$, $R_6$, $R^7$, $R^8$, $R^9$ and $R^{10}$ each independently represent hydrogen or a group which can bond to phenyl, provided that $R^1$ and $R^{10}$ may optionally be linked directly.

10. The composition according to claim 6, wherein the amount of the resin (A) is from 20 to 99% by weight, the amount of the acid-generator (B) is from 0.05 to 20% by weight, the amount of the tertiary amine compound is from 0.001 to 10% by weight, and the amount of the diphenyl sulfone compound (D) is 0.01 to 20% by weight based on the weight of the total solid component of the composition.

11. A positive photoresist composition comprising (A) a resin which is converted to alkali-soluble from alkali-insoluble or alkali slightly soluble by the action of an acid, wherein the resin is obtained by protecting at least a part of phenolic hydroxyl groups in an alkali soluble resin having a phenol skeleton with a protecting group, (B) an acid generator, (C) a tertiary amine compound and (D) a diphenyl sulfone compound, wherein the acid generator (B) is selected from the group consisting of bis(benzenesulfonyl) diazomethane, bis(4-chlorobenzene-sulfonyl)diazomethane, bis(p-toluenesulfonyl) diazomethane, bis(4-tert-butylbenzenesulfonyl)diazomethane, bis(2,4-xylene-sulfonyl)diazomethane and bis(cyclohexane sulfonyl) diazomethane.

12. The composition according to claim 11, wherein the protecting group is selected from the group consisting of a tert-butoxycarbonyl group, tert-butoxycarbonylmethyl group, tetrahydro-2-pyranyl group, tetrahydro-2-furyl group, methoxymethyl group and 1-ethoxyethyl group.

13. The composition according to claim 11, wherein the diphenyl sulfone compound (D) is a compound represented by the following formula (I):

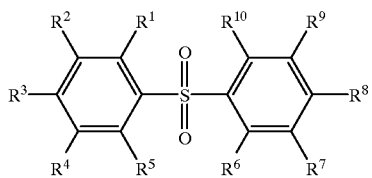

(I)

wherein $R^1$, $R_2$, $R^3$, $R^4$, $R^5$, $R^6$, $R^7$, $R^8$, $R^9$ and $R^{10}$ each independently represent hydrogen or a group which can bond to phenyl, provided that $R^1$ and $R^{10}$ may optionally be linked directly.

14. The composition according to claim 11, wherein the amount of the resin (A) is from 20 to 99% by weight, the amount of the acid-generator (B) is from 0.05 to 20% by weight, the amount of the tertiary amine compound is from 0.001 to 10% by weight, and the amount of the diphenyl sulfone compound (D) is 0.01 to 20% by weight based on the weight of the total solid component of the composition.

* * * * *